(12) United States Patent
Chibashi et al.

(10) Patent No.: US 10,515,709 B2
(45) Date of Patent: Dec. 24, 2019

(54) SAMPLE- AND-HOLD CIRCUIT AND DISPLAY DEVICE

(71) Applicant: SONY CORPORATION, Tokyo (JP)

(72) Inventors: Masaru Chibashi, Kanagawa (JP); Ken Kikuchi, Tokyo (JP); Takaaki Sugiyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/779,265

(22) PCT Filed: Oct. 31, 2016

(86) PCT No.: PCT/JP2016/082315
§ 371 (c)(1),
(2) Date: May 25, 2018

(87) PCT Pub. No.: WO2017/104280
PCT Pub. Date: Jun. 22, 2017

(65) Prior Publication Data
US 2018/0330797 A1 Nov. 15, 2018

(30) Foreign Application Priority Data
Dec. 16, 2015 (JP) .................................. 2015-245531

(51) Int. Cl.
*G11C 27/02* (2006.01)
*G09G 3/20* (2006.01)
*G09G 3/32* (2016.01)

(52) U.S. Cl.
CPC ............. *G11C 27/026* (2013.01); *G09G 3/20* (2013.01); *G09G 3/32* (2013.01); *G09G 2310/0294* (2013.01)

(58) Field of Classification Search
CPC ..... G11C 27/026; G11C 27/02; G11C 27/024; G09G 3/32; G09G 3/20; G09G 2310/0294
See application file for complete search history.

(56) References Cited

U.S. PATENT DOCUMENTS

2002/0186054 A1* 12/2002 Shirasaki ............. G11C 27/024
327/94
2004/0178849 A1* 9/2004 Kimura ................. G11C 19/184
330/253
(Continued)

FOREIGN PATENT DOCUMENTS

JP 63-168899 A 7/1988
JP 2002-197886 A 7/2002

OTHER PUBLICATIONS

International Search Report and Written Opinion of PCT Application No. PCT/JP2016/082315, dated Jan. 17, 2017, 06 pages of ISRWO.

*Primary Examiner* — Ibrahim A Khan
(74) *Attorney, Agent, or Firm* — Chip Law Group

(57) ABSTRACT

A sample-and-hold circuit of the disclosure includes: a differential pair that includes a first MOS transistor and a second MOS transistor, in which respective source terminals of the first MOS transistor and the second MOS transistor are interconnected to a specified node, and an input signal is input to a gate terminal of the first MOS transistor; a capacitor that is coupled to a gate terminal of the second MOS transistor, and samples and holds the input signal; a switch transistor that has a source terminal coupled to the capacitor and the gate terminal of the second MOS transistor, and causes the capacitor to sample and hold the input signal upon application of a predetermined ON voltage; and an ON-voltage control transistor that couples a gate terminal (Continued)

of the switch transistor to the specified node when causing the input signal to be sampled and held.

6 Claims, 9 Drawing Sheets

(56) References Cited

U.S. PATENT DOCUMENTS

| | | | | |
|---|---|---|---|---|
| 2004/0196098 | A1* | 10/2004 | Shirasaki | H03F 1/02 330/51 |
| 2004/0207448 | A1* | 10/2004 | Kida | G09G 3/3688 327/333 |
| 2005/0024313 | A1* | 2/2005 | Nakajima | G02F 1/13394 345/95 |
| 2005/0184763 | A1* | 8/2005 | Kondo | G11C 19/00 327/94 |
| 2012/0146729 | A1* | 6/2012 | Chen | H03F 1/086 330/278 |
| 2014/0368415 | A1* | 12/2014 | Kim | G09G 3/3233 345/77 |

* cited by examiner

[FIG. 1]
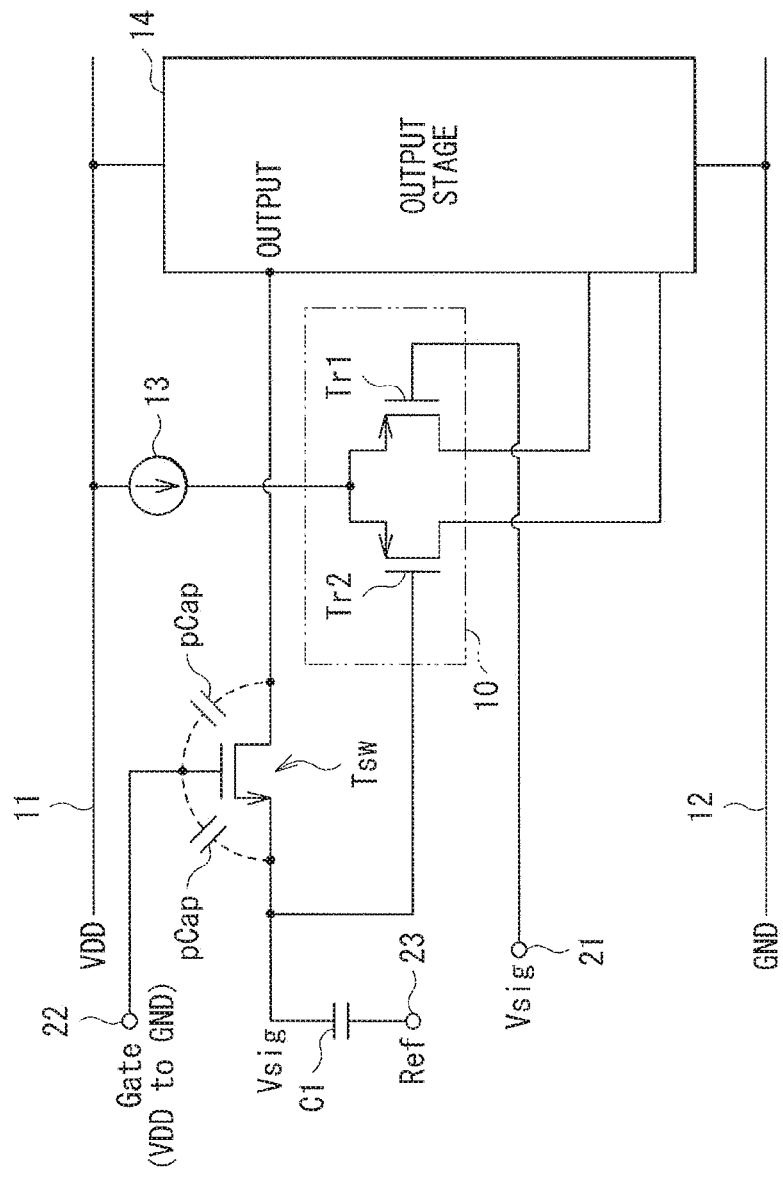

[ FIG. 2 ]
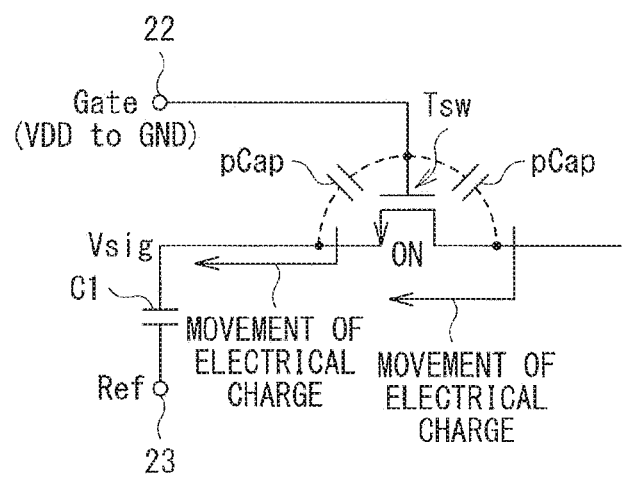
[ FIG. 3 ]
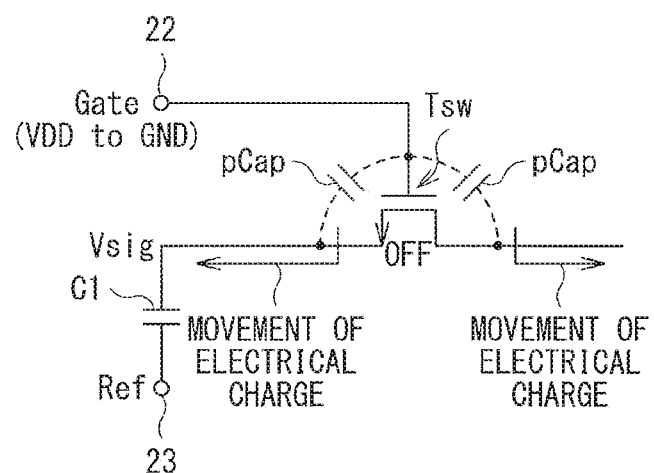

[ FIG. 4 ]
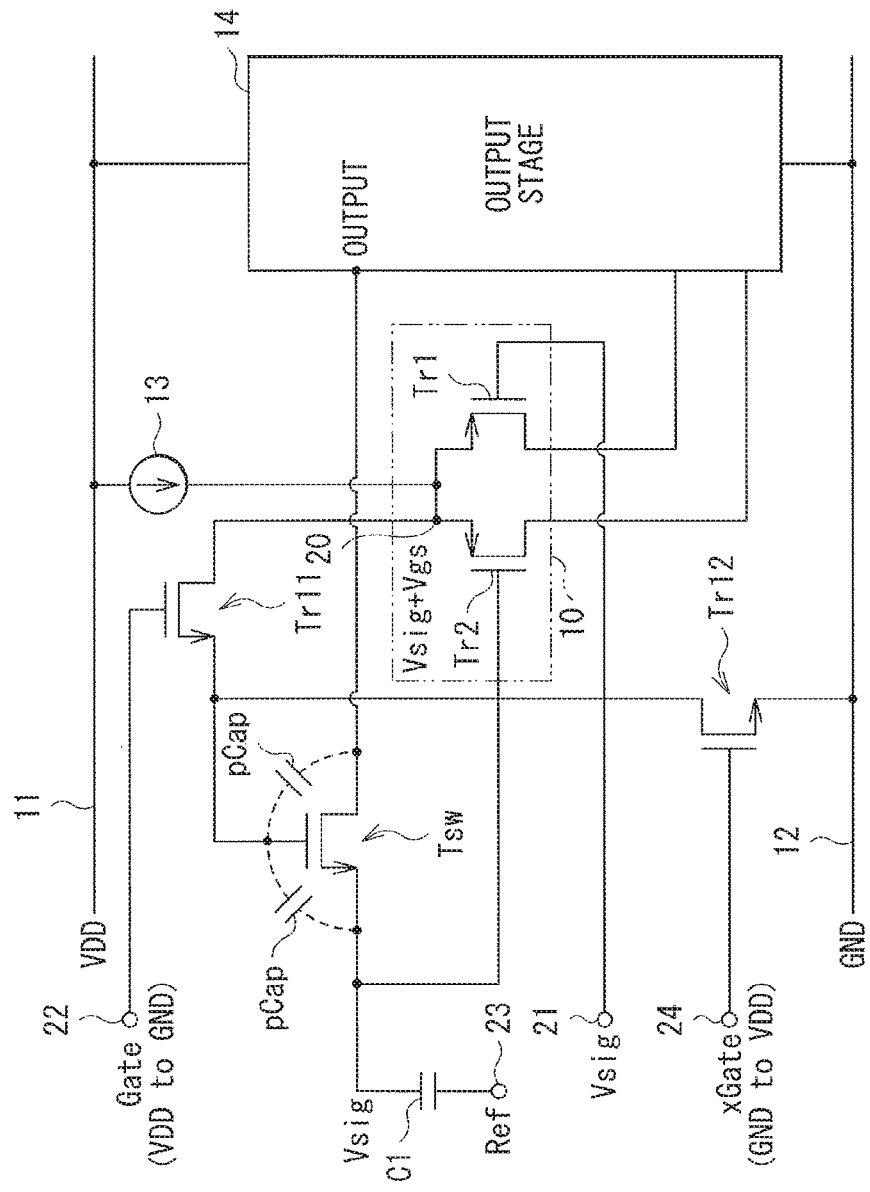

[ FIG. 5 ]
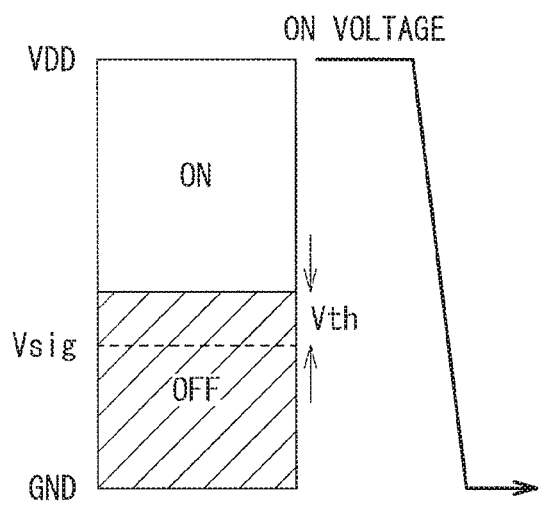
[ FIG. 6 ]
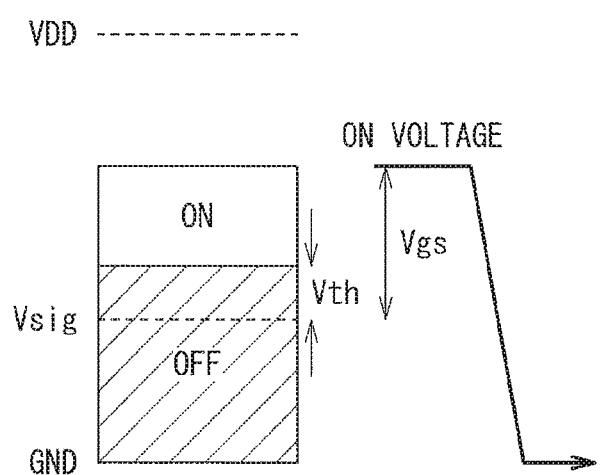

[ FIG. 7 ]
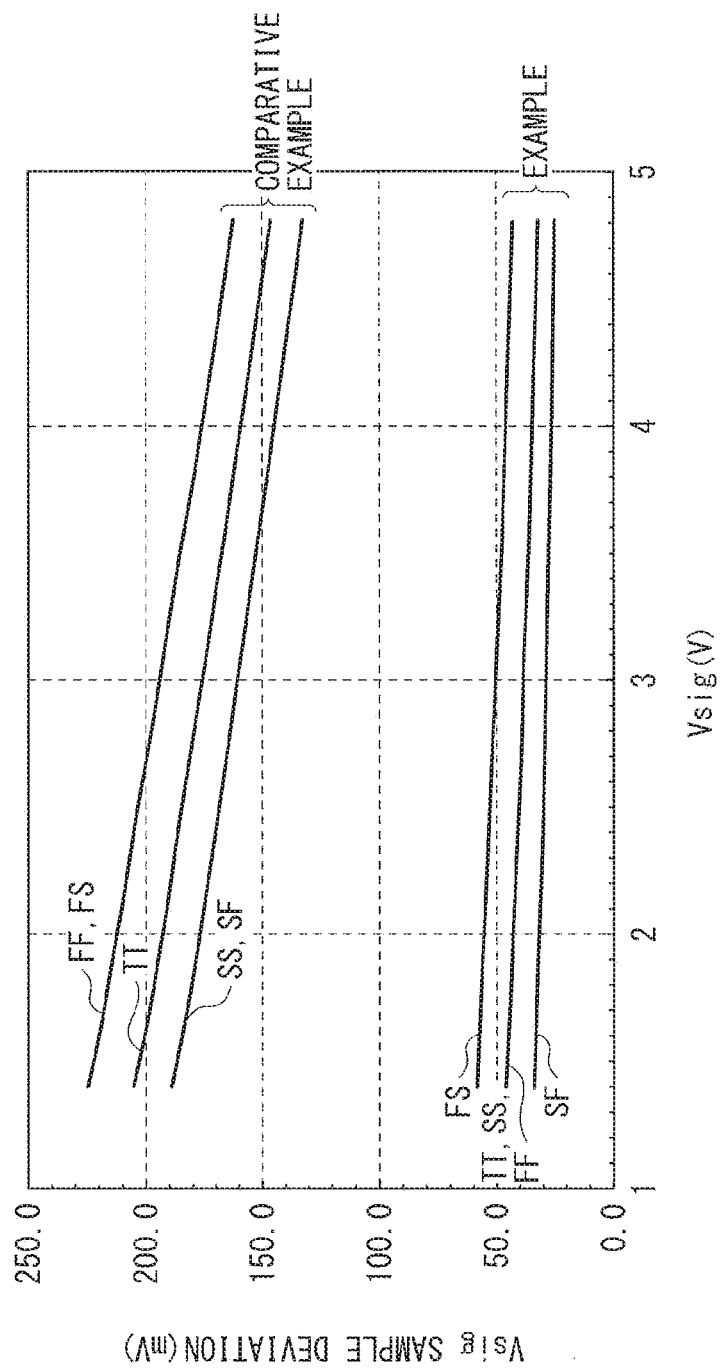

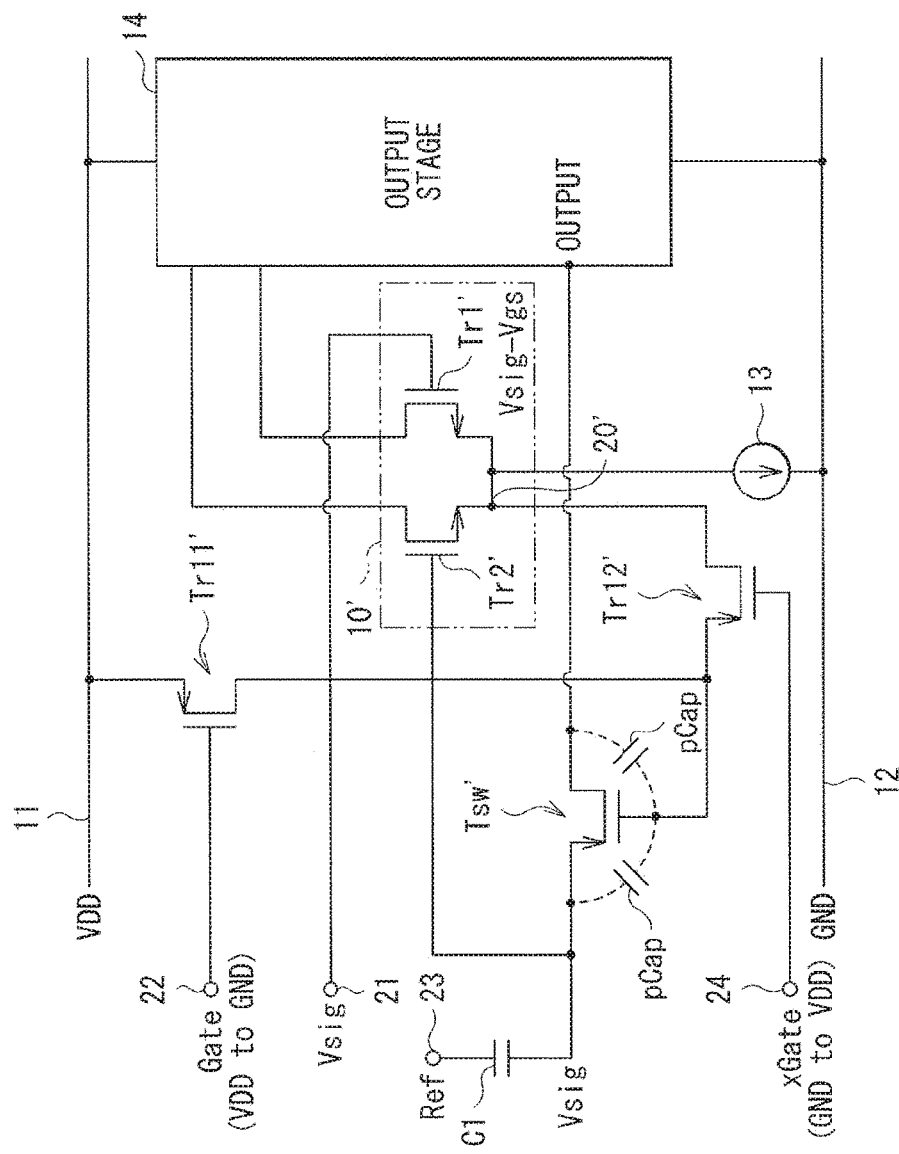
[FIG. 8]

[ FIG. 9 ]
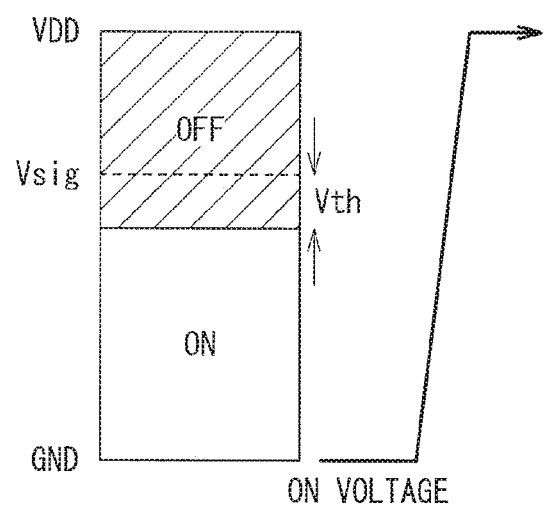
[ FIG. 10 ]
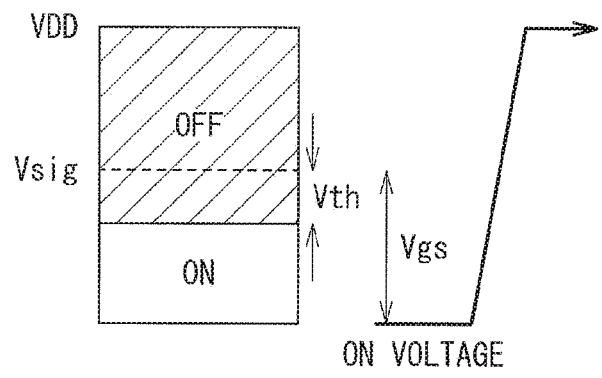

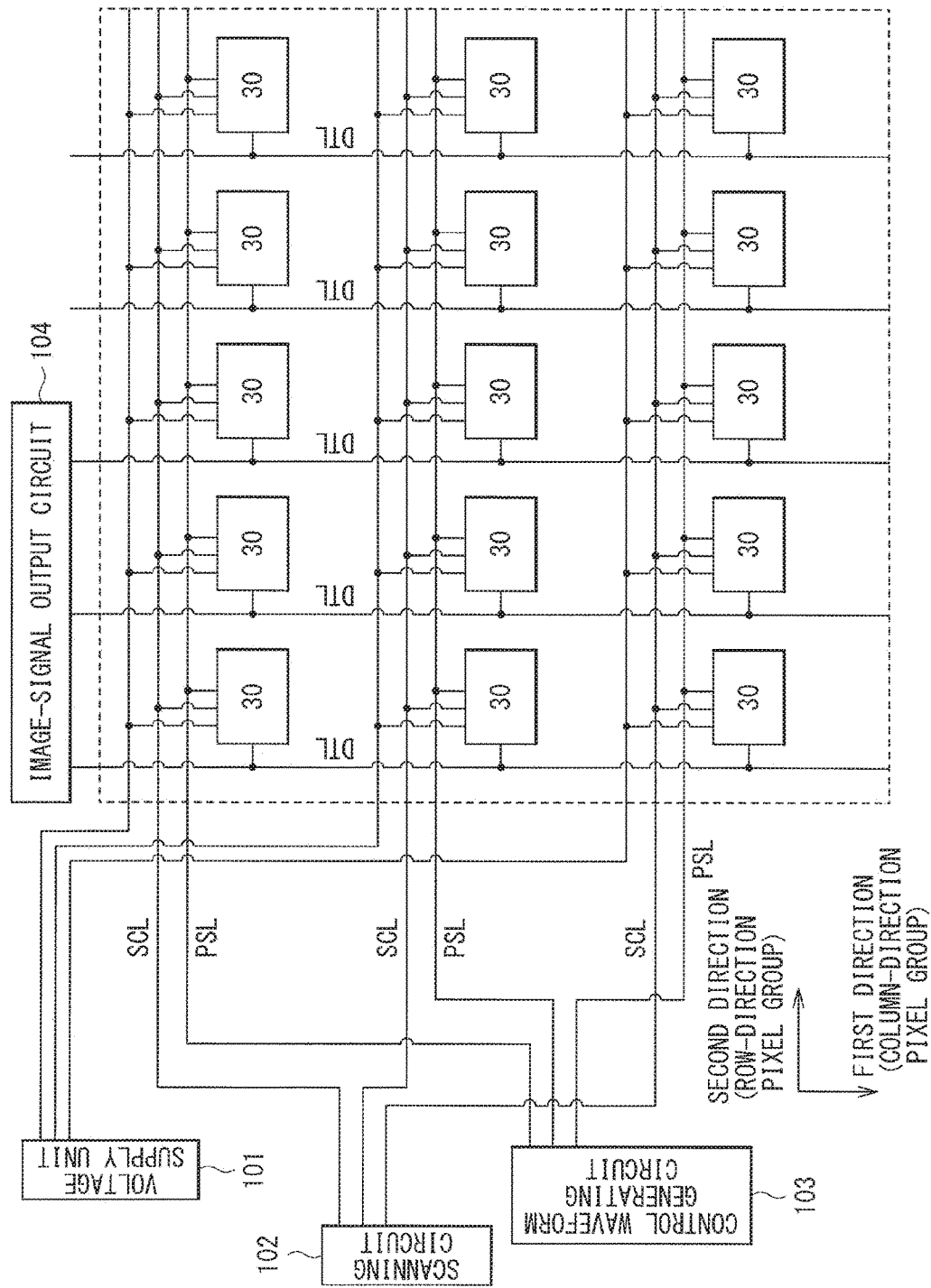
[ FIG. 11 ]

[FIG. 12]
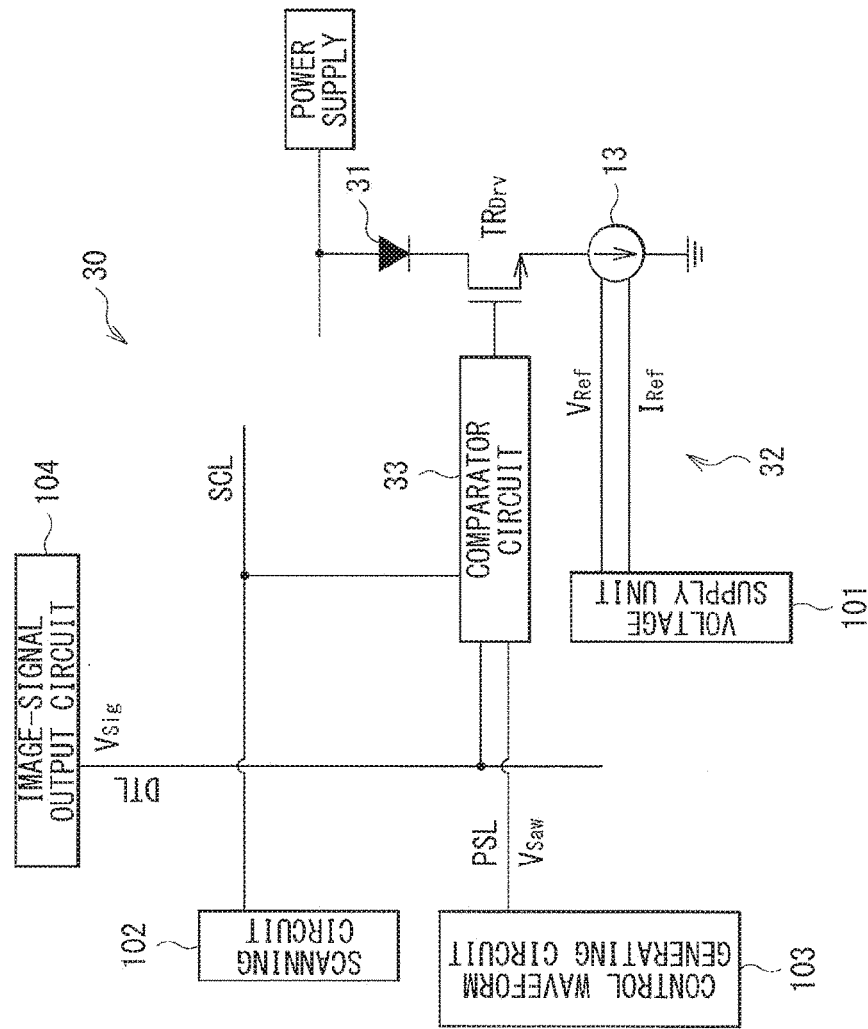

SAMPLE- AND-HOLD CIRCUIT AND DISPLAY DEVICE

CROSS REFERENCE TO RELATED APPLICATIONS

This application is a U.S. National Phase of International Patent Application No. PCT/JP2016/082315 filed on Oct. 31, 2016, which claims priority benefit of Japanese Patent Application No. JP 2015-245531 filed in the Japan Patent Office on Dec. 16, 2015. Each of the above-referenced applications is hereby incorporated herein by reference in its entirety.

TECHNICAL FIELD

The disclosure relates to a sample-and-hold circuit and a display device.

BACKGROUND ART

There is known a sample-and-hold circuit used in an analog/digital (A/D) converter, a comparator circuit, or the like. The sample-and-hold circuit is a circuit that includes a switch transistor and a capacitor, and causes the capacitor to sample and hold an analog voltage signal in accordance with ON/OFF operation of the switch transistor.

CITATION LIST

Patent Literature

PTL 1: Japanese Unexamined Patent Application Publication No. 2002-197886

SUMMARY OF THE INVENTION

PTL 1 proposes a circuit configuration for suppressing an influence of clock feedthrough caused by a parasitic capacitance between a gate of a switch transistor and a capacitor in a sample-and-hold circuit. To suppress a deviation of a signal voltage stored in the capacitor due to the influence of clock feedthrough, the sample-and-hold circuit described in PTL 1 uses a voltage generating circuit, which generates an ON voltage moderately higher than the voltage of an input signal, to drive the switch transistor. However, this circuit configuration demands the layout area for configuring the voltage generating circuit and also increases the power consumption.

It is desirable to provide a sample-and-hold circuit and a display device that make it possible to suppress a sample deviation.

A sample-and-hold circuit according to an embodiment of the disclosure includes: a differential pair that includes a first MOS transistor and a second MOS transistor, in which respective source terminals of the first MOS transistor and the second MOS transistor are interconnected to a specified node, and an input signal is input to a gate terminal of the first MOS transistor; a capacitor that is coupled to a gate terminal of the second MOS transistor, and samples and holds the input signal; a switch transistor that has a source terminal coupled to the capacitor and the gate terminal of the second MOS transistor, and causes the capacitor to sample and hold the input signal upon application of a predetermined ON voltage; and an ON-voltage control transistor that couples a gate terminal of the switch transistor to the specified node when causing the input signal to be sampled and held.

A display device according to an embodiment of the disclosure includes a comparator circuit that has a sample-and-hold circuit and to which an image signal is input as an input signal. The sample-and-hold circuit is configured by the sample-and-hold circuit according to the above-described disclosure.

In the sample-and-hold circuit or the display device according to the embodiment of the disclosure, the gate terminal of the switch transistor is coupled to the specified node of the differential pair when the input signal is sampled and held.

According to the sample-and-hold circuit or the display device of the embodiment of the disclosure, the gate terminal of the switch transistor is coupled to the specified node of the differential pair when the input signal is sampled and held; therefore, it is possible to suppress a sample deviation.

It is to be noted that the effect described here is not necessarily limited, and it may include any effect described in the disclosure.

BRIEF DESCRIPTION OF DRAWINGS

FIG. 1 is a circuit diagram illustrating a configuration example of a sample-and-hold circuit according to a comparative example.

FIG. 2 is an explanatory diagram illustrating a movement of electrical charge when a switch transistor in the sample-and-hold circuit illustrated in FIG. 1 is in ON state.

FIG. 3 is an explanatory diagram illustrating a movement of electrical charge when the switch transistor in the sample-and-hold circuit illustrated in FIG. 1 is in OFF state.

FIG. 4 is a circuit diagram illustrating a configuration example of a sample-and-hold circuit according to a first embodiment of the disclosure.

FIG. 5 is an explanatory diagram illustrating a relationship between a power supply voltage VDD and an ON voltage of the switch transistor in the sample-and-hold circuit illustrated in FIG. 1.

FIG. 6 is an explanatory diagram illustrating a relationship between a power supply voltage VDD and an ON voltage of a switch transistor in the sample-and-hold circuit illustrated in FIG. 4.

FIG. 7 is a characteristic diagram illustrating a relationship between a signal voltage Vsig of an input signal and a sample deviation.

FIG. 8 is a circuit diagram illustrating a configuration example of a sample-and-hold circuit according to a second embodiment.

FIG. 9 is an explanatory diagram illustrating an ON voltage of a switch transistor in a sample-and-hold circuit according to a comparative example.

FIG. 10 is an explanatory diagram illustrating an ON voltage of a switch transistor in the sample-and-hold circuit illustrated in FIG. 8.

FIG. 11 is a block diagram illustrating a configuration example of a display device to which the sample-and-hold circuit according to any of the embodiments is applied.

FIG. 12 is a block diagram illustrating a configuration example of pixels in the display device illustrated in FIG. 11.

MODES FOR CARRYING OUT THE INVENTION

In the following, some embodiments of the disclosure are described in detail with reference to the drawings. It is to be noted that description is made in the following order:

0. Outline and Problems of Sample-and-hold circuit According to Comparative Example (FIGS. 1 to 3)
1. First Embodiment (FIGS. 4 to 7)
   1.1 Configuration
   1.2 Operation
   1.3 Effects
2. Second Embodiment (FIGS. 8 to 10)
3. Application Example (FIGS. 11 and 12)
4. Other Embodiments

0. Outline and Problems of Sample-and-Hold Circuit According to Comparative Example FIG. 1 illustrates a configuration example of a sample-and-hold circuit according to a comparative example.

Configuration of Sample-and-Hold Circuit According to Comparative Example

The sample-and-hold circuit according to the comparative example includes a switch transistor Tsw, a capacitor C1, a differential pair 10, a power-supply-voltage (VDD) supply line 11, a ground-voltage (GND) supply line 12, a current source 13, and an output stage circuit 14. Furthermore, the sample-and-hold circuit according to the comparative example includes a Vsig input terminal 21, a gate-voltage-signal (Gate) input terminal 22, and a reference-voltage-signal (Ref) input terminal 23.

For example, in a case where the sample-and-hold circuit is applied to a display device, the output stage circuit 14 is a pixel driving circuit or the like.

The differential pair 10 includes a pair of metal-oxide-semiconductor (MOS) transistors including a first MOS transistor Tr1 and a second MOS transistor Tr2. The first and second MOS transistors Tr1 and Tr2 are p-type MOS (PMOS) transistors. Respective source terminals of the first and second MOS transistors Tr1 and Tr2 are interconnected. The source terminals of the first and second MOS transistors Tr1 and Tr2 are coupled to the current source 13. Respective drain terminals of the first and second MOS transistors Tr1 and Tr2 are coupled to the output stage circuit 14.

An input signal of a signal voltage Vsig is input to a gate terminal of the first MOS transistor Tr1. The differential pair 10 serves as a negative feedback circuit, where the gate terminal of the first MOS transistor Tr1 serves as a positive input terminal and a gate terminal of the second MOS transistor Tr2 serves as a negative input terminal, and when the switch transistor Tsw is ON.

The switch transistor Tsw is an n-type MOS (NMOS) transistor. A source terminal of the switch transistor Tsw is coupled to one end of the capacitor C1 and the gate terminal of the second MOS transistor Tr2. When a predetermined ON voltage has been applied to a gate terminal of the switch transistor Tsw, the switch transistor Tsw causes the capacitor C1 to sample and hold the input signal. As a predetermined ON voltage, a VDD-potential gate voltage signal Gate is input to the gate terminal of the switch transistor Tsw. A drain terminal of the switch transistor Tsw is coupled to the output stage circuit 14.

One end of the capacitor C1 is coupled to the gate terminal of the second MOS transistor Tr2; the capacitor C1 samples and holds an input signal in accordance with a switching operation of the switch transistor Tsw. A reference voltage signal Ref is input to the other end of the capacitor C1.

Operation and Problems of Sample-and-Hold Circuit According to Comparative Example FIG. 2 illustrates a movement of electrical charge when the switch transistor Tsw in the sample-and-hold circuit illustrated in FIG. 1 is in ON state. FIG. 3 illustrates a movement of electrical charge when the switch transistor Tsw in the sample-and-hold circuit illustrated in FIG. 1 is in OFF state. FIG. 5 illustrates a relationship between the power supply voltage VDD and the ON voltage of the switch transistor Tsw in the sample-and-hold circuit illustrated in FIG. 1.

The sample-and-hold circuit according to the comparative example illustrated in FIG. 1 is a comparator circuit or a buffer amplifier with the differential pair 10 as an input stage. In FIG. 1, when the gate voltage signal Gate has the VDD potential, the switch transistor Tsw is turned ON and the differential pair 10 forms negative feedback, and the positive input terminal and the negative input terminal of the differential pair 10 have the same potential, and the signal voltage Vsig of the input signal is stored in the capacitor C1. When the potential of the gate voltage signal Gate next changes to a GND potential and the switch transistor Tsw is turned OFF, the value of the signal voltage Vsig of the input signal stored in the capacitor C1 through a parasitic capacitance pCap of the switch transistor Tsw deviates. This is prominent in a case where the VDD potential is high and there is a large discrepancy from the signal voltage Vsig of the input signal as illustrated in FIG. 5.

In the sample-and-hold circuit according to the comparative example, if the gate terminal of the switch transistor Tsw changes from the VDD potential to the GND potential at the end of a sampling period, electric charge flows to the capacitor C1, having stored therein the signal voltage Vsig of the input signal, through the parasitic capacitance pCap of the switch transistor Tsw, and the potential deviates. This flowing electric charge flows to the capacitor C1 from both the source side and the drain side of the switch transistor Tsw if the switch transistor Tsw is in ON state and is electrified as illustrated in FIG. 2. On the other hand, if the switch transistor Tsw is in OFF state and is not electrified as illustrated in FIG. 3, the electric charge flows to the capacitor C1 from the source side only. Accordingly, the larger the discrepancy from the VDD potential because of the low signal voltage Vsig of the input signal, the more the flowing electric charge and the larger the deviation of the sampled potential.

1. First Embodiment

Subsequently, a first embodiment of the disclosure is described. In the following, description of a component having the substantially similar configuration and workings, etc. to the above-described comparative example is omitted accordingly.

[1.1 Configuration]

FIG. 4 illustrates a configuration example of a sample-and-hold circuit according to the first embodiment of the disclosure. FIG. 6 illustrates a relationship between the power supply voltage VDD and an ON voltage of the switch transistor Tsw in the sample-and-hold circuit illustrated in FIG. 4.

The sample-and-hold circuit according to the present embodiment further includes an ON-voltage control transistor Tr11, an OFF-voltage control transistor Tr12, and an x-gate-voltage-signal (xGate) input terminal 24 as compared with the configuration of the sample-and-hold circuit according to the comparative example illustrated in FIG. 1.

The ON-voltage control transistor Tr11 is an NMOS transistor. A source terminal of the ON-voltage control transistor Tr11 is coupled to the gate terminal of the switch transistor Tsw. A gate voltage signal Gate is input to a gate terminal of the ON-voltage control transistor Tr11. A drain terminal of the ON-voltage control transistor Tr11 is coupled to a specified node 20 at which the first MOS transistor Tr1 and the second MOS transistor Tr2 are interconnected.

When causing an input signal to be sampled and held, the ON-voltage control transistor Tr11 couples the gate terminal of the switch transistor Tsw to the specified node 20. Only in a case where the differential pair 10 serves as a negative feedback circuit, the ON-voltage control transistor Tr11 couples the gate terminal of the switch transistor Tsw to the specified node 20. Thereby, the ON voltage of the switch transistor Tsw becomes a voltage of the specified node 20.

The voltage of the specified node 20 here is the sum (Vsig+Vgs) of the signal voltage Vsig of the input signal and a gate-to-source voltage Vgs in the first and second MOS transistors Tr1 and Tr2. The voltage of the specified node 20 when the input signal is sampled and held is a voltage lower than the power supply voltage VDD as illustrated in FIG. 6.

The OFF-voltage control transistor Tr12 is an NMOS transistor. A source terminal of the OFF-voltage control transistor Tr12 is coupled to the ground-voltage supply line 12. An x-gate voltage signal xGate is input to a gate terminal of the OFF-voltage control transistor Tr12. A drain terminal of the OFF-voltage control transistor Tr12 is coupled to the gate terminal of the switch transistor Tsw.

The OFF-voltage control transistor Tr12 applies, as a predetermined OFF voltage causing the switch transistor Tsw to be turned OFF, a GND voltage to the gate terminal of the switch transistor Tsw.

Other configurations may be substantially similar to those of the sample-and-hold circuit according to the above-described comparative example.

[1.2 Operation]

As described above, in the sample-and-hold circuit according to the comparative example, the gate voltage of the switch transistor Tsw is changed from the power supply voltage VDD to the GND voltage at the end of sampling to turn the switch transistor Tsw OFF. At this time, there arises the movement of electrical charge from the gate terminal to the capacitor C1 through the parasitic capacitance pCap as illustrated in FIG. 2, and, until the switch transistor Tsw is turned OFF, electrical charge of the parasitic capacitance pCap flows to the capacitor C1 from both the source side and the drain side of the switch transistor Tsw. However, after the switch transistor Tsw is turned OFF, electrical charge just for one side flows to the capacitor C1 from only the source side of the switch transistor Tsw as illustrated in FIG. 3, and the sampled voltage signal deviates. To suppress this, the ON-state voltage of the switch transistor Tsw may be reduced as illustrated in FIG. 6.

As illustrated in FIG. 6, if the switch transistor Tsw is driven with a potential enough to turn the switch transistor Tsw ON and not to cause a large discrepancy from a signal voltage Vsig of an input signal sampled, the period in which the switch transistor Tsw is ON when changing from ON to OFF is shortened, which suppresses a sample deviation. Incidentally, in FIGS. 5 and 6, Vth denotes a threshold voltage from the signal voltage Vsig; the threshold voltage enables the switch transistor Tsw to be turned ON. Meanwhile, in a technique using a voltage generating circuit as described in Citation List (Japanese Unexamined Patent Application Publication No. 2002-197886), it demands the layout area for the voltage generating circuit and also increases the power consumption. Furthermore, the number of circuit elements increases in order to configure the voltage generating circuit.

In the present embodiment, only when the comparator circuit or the buffer amplifier with the differential pair 10 as the input stage forms the negative feedback, i.e., only when the switch transistor Tsw is electrified, the voltage of the specified node 20 of the differential pair 10 becomes "Vsig+ Vgs".

FIG. 7 illustrates a relationship between the signal voltage Vsig of the input signal and a sample deviation. FIG. 7 depicts characteristics of the sample-and-hold circuit illustrated in FIG. 1 as a comparative example. Furthermore, it also depicts characteristics of the sample-and-hold circuit illustrated in FIG. 4 as an Example.

In FIG. 7, the horizontal axis indicates a signal voltage Vsig (V). In FIG. 7, the vertical axis indicates a difference between the signal voltage Vsig and a voltage actually sampled and held by the capacitor C1 as a sample deviation amount.

In FIG. 7, respective characteristics of the MOS transistors configuring the sample-and-hold circuit are represented by T (Typical), F (Fast), and S (Slow). Furthermore, in FIG. 7, for example, FS represents that the characteristic of the NMOS transistor in the sample-and-hold circuit is F (Fast), and the characteristic of the PMOS transistor is S (Slow). That is, the former letter and the latter letter of each code such as TT, FF, and FS in FIG. 7 respectively represent the characteristic of the NMOS transistor and the characteristic of the PMOS transistor in the sample-and-hold circuit.

As illustrated in FIG. 7, in the sample-and-hold circuit illustrated in FIG. 4, the sample deviation with respect to the characteristic variation of the MOS transistors is improved further than the sample-and-hold circuit according to the comparative example. In the sample-and-hold circuit according to the comparative example, in cases of FF, FS, SS, and SF around a case of TT (Typical), the sample deviation varies. On the other hand, in the sample-and-hold circuit illustrated in FIG. 4, the absolute value of sample deviation is reduced overall, and Vsig dependence is reduced. Further, with respect to the characteristic variation of the MOS transistors, about the same sample deviation is seen in a case where the NMOS transistor and the PMOS transistor vary in the same characteristic direction just like the cases of TT, SS, and FF. Moreover, there is an improvement effect that the sample deviation amount varies only if the characteristic variation of the MOS transistors becomes imbalanced just like the cases of FS and SF.

Other operations may be substantially similar to those of the sample-and-hold circuit according to the above-described comparative example.

[1.3 Effects]

As described above, according to the present embodiment, the gate terminal of the switch transistor Tsw is coupled to the specified node 20 of the differential pair 10 when the input signal is sampled and held; therefore, it is possible to suppress the sample deviation.

According to the present embodiment, whatever voltage the signal voltage Vsig of the input signal sampled is, the ON voltage of the switch transistor Tsw is constantly "Vsig+ Vgs", and the sample deviation is suppressed (FIG. 7). Furthermore, according to the present embodiment, Vsig dependence of the sample deviation amount is reduced (FIG. 7).

Moreover, according to the present embodiment, an extra circuit, such as an ON-voltage generating circuit, is not necessary, and there is no increase in power consumption just like a case of using an ON-voltage generating circuit. According to the present embodiment, just the addition of two circuit elements (the ON-voltage control transistor Tr11 and the OFF-voltage control transistor Tr12) to the sample-and-hold circuit in the comparative example achieves a similar effect to the case of using an ON-voltage generating circuit, and the increase of the layout area is very small. These effects are significant particularly in a case of the application to a multi-channel circuit, such as a display driver.

It is to be noted that the effects described in the specification are just examples, and effects of the present embodiment are not limited to them and may include other effects. The same applies to effects of other embodiments described below.

2. Second Embodiment

Subsequently, a second embodiment of the disclosure is described. In the following, description of a component having the substantially similar configuration and workings to the above-described first embodiment is omitted accordingly.

FIG. 8 illustrates an example of a sample-and-hold circuit according to the second embodiment of the disclosure. FIG. 10 illustrates an ON voltage in the sample-and-hold circuit illustrated in FIG. 8.

The sample-and-hold circuit illustrated in FIG. 8 has a circuit configuration in which the NMOS transistors in the sample-and-hold circuit illustrated in FIG. 4 are replaced by PMOS transistors and the PMOS transistors by NMOS transistors.

The sample-and-hold circuit according to the present embodiment includes a differential pair 10' instead of the differential pair 10 in the configuration of the sample-and-hold circuit illustrated in FIG. 4. The differential pair 10' includes a pair of MOS transistors including a first MOS transistor Tr1' and a second MOS transistor Tr2'. The first and second MOS transistors Tr1' and Tr2' are NMOS transistors.

Furthermore, the sample-and-hold circuit according to the present embodiment includes a switch transistor Tsw' instead of the switch transistor Tsw in the configuration of the sample-and-hold circuit illustrated in FIG. 4. The switch transistor Tsw' is a PMOS transistor.

Moreover, the sample-and-hold circuit according to the present embodiment includes an ON-voltage control transistor Tr12' instead of the ON-voltage control transistor Tr11 in the configuration of the sample-and-hold circuit illustrated in FIG. 4. Furthermore, the sample-and-hold circuit according to the present embodiment includes an OFF-voltage control transistor Tr11' instead of the OFF-voltage control transistor Tr12 in the configuration of the sample-and-hold circuit illustrated in FIG. 4.

The ON-voltage control transistor Tr12' is a PMOS transistor. A source terminal of the ON-voltage control transistor Tr12' is coupled to a gate terminal of the switch transistor Tsw'. An x-gate voltage signal xGate is input to a gate terminal of the ON-voltage control transistor Tr12'. A drain terminal of the ON-voltage control transistor Tr12' is coupled to a specified node 20' at which the first MOS transistor Tr1' and the second MOS transistor Tr2' are interconnected.

When causing an input signal to be sampled and held, the ON-voltage control transistor Tr12' couples the gate terminal of the switch transistor Tsw' to the specified node 20'. Only in a case where the differential pair 10' serves as a negative feedback circuit, the ON-voltage control transistor Tr12' couples the gate terminal of the switch transistor Tsw' to the specified node 20'. Thereby, the ON voltage of the switch transistor Tsw' becomes a voltage of the specified node 20'.

The voltage of the specified node 20' here is the difference (Vsig−Vgs) between the signal voltage Vsig of the input signal and the gate-to-source voltage Vgs in the first and second MOS transistors Tr1' and Tr2'. The voltage of the specified node 20' when the input signal is sampled and held is a voltage higher than the GND voltage as illustrated in FIG. 10.

The OFF-voltage control transistor Tr11' is a PMOS transistor. A source terminal of the OFF-voltage control transistor Tr11' is coupled to the power-supply-voltage supply line 11. The gate voltage signal Gate is input to a gate terminal of the OFF-voltage control transistor Tr11'. A drain terminal of the OFF-voltage control transistor Tr11' is coupled to the gate terminal of the switch transistor Tsw'.

The OFF-voltage control transistor Tr11' applies, as a predetermined OFF voltage causing the switch transistor Tsw' to be turned OFF, the power supply voltage VDD to the gate terminal of the switch transistor Tsw' as illustrated in FIG. 10.

FIG. 9 illustrates an ON voltage in a sample-and-hold circuit according to a comparative example. It is to be noted that the sample-and-hold circuit according to the comparative example here has a circuit configuration in which the NMOS transistors in the sample-and-hold circuit illustrated in FIG. 1 are replaced by PMOS transistors and the PMOS transistors by NMOS transistors. Incidentally, in FIGS. 9 and 10, Vth denotes a threshold voltage from the signal voltage Vsig; the threshold voltage enables the switch transistor Tsw to be turned ON.

In the sample-and-hold circuit according to the comparative example, the ON voltage of the switch transistor Tsw' is the GND voltage as illustrated in FIG. 9, and the discrepancy from the signal voltage Vsig of the input signal is large. On the other hand, in the sample-and-hold circuit according to the present embodiment, as illustrated in FIG. 10, the switch transistor Tsw' is driven with a potential enough to turn the switch transistor Tsw' ON and not to cause a large discrepancy from the signal voltage Vsig of the input signal sampled. Accordingly, the sample deviation is suppressed just like the above-described first embodiment.

Other configurations, operations, and effects may be substantially similar to those in the comparative example or the first embodiment.

3. Application Example

Subsequently, an application example of the sample-and-hold circuit described in any of the above embodiments is described.

The sample-and-hold circuit in the disclosure is applicable to A/D converters and comparator circuits in various devices. Here, there is described an example in which the sample-and-hold circuit is applied to a comparator circuit of a display device as one example.

FIG. 11 illustrates a configuration example of a display device to which the sample-and-hold circuit according to any of the embodiments is applied. FIG. 12 illustrates a configuration example of pixels in the display device illustrated in FIG. 11. It is to be noted that for simplicity of the drawing, only 3×5 pixels are depicted in FIG. 11; however, a configuration having pixels more than this may be adopted.

The display device includes a plurality of pixels 30 arranged in a two-dimensional matrix; the pixels 30 each include a light-emitting unit 31 and a drive circuit 32 that drives the light-emitting unit 31. The pixels 30 may be sub-pixels. The plurality of pixels 30 are arranged in a two-dimensional matrix in a first direction and a second direction. The display device further includes, as peripheral drive units for driving the pixels 30, a voltage supply unit 101, a scanning circuit 102, a control waveform generating circuit 103, and an image-signal output circuit 104. The scanning circuit 102 is coupled to scanning lines SCL.

The light-emitting unit 31 is a light-emitting diode (LED), and an anode electrode is coupled to a power supply unit. The respective drive circuits 32 of the plurality of pixels 30 each include a comparator circuit 33, a current source 34, and a light-emitting unit driving transistor $TR_{Drv}$.

The light-emitting unit driving transistor $TR_{Drv}$ is, for example, an n-channel transistor. However, it is not limited to the n-channel transistor. A drain electrode of the light-emitting unit driving transistor $TR_{Drv}$ is coupled to a cathode electrode of the light-emitting unit 31, and a source electrode is coupled to a grounded part (ground) through the current source 34.

The sample-and-hold circuit according to any of the above-described embodiments is applicable to the comparator circuit 33. The comparator circuit 33 is given a control waveform (an emission control waveform) $V_{Saw}$ having saw-tooth wavelike voltage changes from the control waveform generating circuit 103 through a control waveform line PSL, and also is given a signal voltage Vsig from the image-signal output circuit 104 through a data line DTL. Incidentally, the signal voltage Vsig is specifically a voltage of an emission intensity signal (an image signal voltage) that controls the emission state (luminance) of the pixel 30. The comparator circuit 33 compares the control waveform $V_{Saw}$ with a potential based on the signal voltage Vsig, and outputs a predetermined voltage based on a result of the comparison (for the sake of convenience, referred to as a "first predetermined voltage").

A reference voltage $V_{Ref}$ and a reference current $I_{Ref}$ are supplied from the voltage supply unit 101 to the current source 34. The current source 34 generates a constant current by performing a voltage-to-current conversion on the basis of the reference voltage $V_{Ref}$ and the reference current $I_{Ref}$. The light-emitting unit driving transistor $TR_{Drv}$ is driven by the first predetermined voltage output from the comparator circuit 33, thereby supplying a current to the light-emitting unit 31 and causing the light-emitting unit 31 to emit light. That is, the light-emitting unit driving transistor $TR_{Drv}$ serves as a current supply unit that supplies a current to the light-emitting unit 31 in accordance with an output of the comparator circuit 33.

Since the pixels 30 each have the drive circuit 32 including the comparator circuit 33, the display device adopts a drive method that causes the light-emitting units 31 to emit light, i.e., PWM-driving the light-emitting units 31 for a time corresponding to a potential based on a signal voltage Vsig. This PWM driving method has an advantage of being able to reduce the emission variation of the light-emitting units 31.

4. Other Embodiments

The technique according to the disclosure is not limited to description of the above-described embodiments, and enables various modification embodiments.

For example, the technology enables the following configurations.

(1)

A sample-and-hold circuit including:

a differential pair that includes a first MOS transistor and a second MOS transistor, respective source terminals of the first MOS transistor and the second MOS transistor being interconnected to a specified node, an input signal being input to a gate terminal of the first MOS transistor;

a capacitor that is coupled to a gate terminal of the second MOS transistor, and samples and holds the input signal;

a switch transistor that has a source terminal coupled to the capacitor and the gate terminal of the second MOS transistor, and causes the capacitor to sample and hold the input signal upon application of a predetermined ON voltage; and an ON-voltage control transistor that couples a gate terminal of the switch transistor to the specified node when causing the input signal to be sampled and held.

(2)

The sample-and-hold circuit according to (1), in which the differential pair serves as a negative feedback circuit, where the gate terminal of the first MOS transistor serves as a positive input terminal and the gate terminal of the second MOS transistor serves as a negative input terminal, and when the switch transistor is ON, and the ON-voltage control transistor couples the gate terminal of the switch transistor to the specified node only in a case where the negative feedback circuit is established.

(3)

The sample-and-hold circuit according to (1) or (2), further including an OFF-voltage control transistor that applies a predetermined OFF voltage to the gate terminal of the switch transistor, the predetermined OFF voltage causing the switch transistor to be turned OFF.

(4)

The sample-and-hold circuit according to any one of (1) to (3), in which a voltage of the specified node is a sum of a voltage of the input signal and a gate-to-source voltage in the first and the second MOS transistors.

(5)

The sample-and-hold circuit according to any one of (1) to (4), further including a power-supply-voltage supply line that supplies a power supply voltage, wherein a voltage of the specified node when the input signal is sampled and held is a voltage lower than the power supply voltage.

(6)

A display device including a comparator circuit to which an image signal is input as an input signal, the comparator circuit including a sample-and-hold circuit, the sample-and-hold circuit including:

a differential pair that includes a first MOS transistor and a second MOS transistor, respective source terminals of the first MOS transistor and the second MOS transistor being interconnected to a specified node, an input signal being input to a gate terminal of the first MOS transistor;

a capacitor that is coupled to a gate terminal of the second MOS transistor, and samples and holds the input signal;

a switch transistor that has a source terminal coupled to the capacitor and the gate terminal of the second MOS transistor, and causes the capacitor to sample and hold the input signal upon application of a predetermined ON voltage; and an ON-voltage control transistor that couples a gate terminal of the switch transistor to the specified node when causing the input signal to be sampled and held.

This application claims the benefit of Japanese Priority Patent Application JP2015-245531 filed with the Japan Patent Office on Dec. 16, 2015, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A sample-and-hold circuit, comprising:
   a differential pair that includes a first MOS transistor and a second MOS transistor, wherein respective source terminals of the first MOS transistor and the second MOS transistor being interconnected to a specified node, an input signal being input to a gate terminal of the first MOS transistor;
   a capacitor that is coupled to a gate terminal of the second MOS transistor, wherein the capacitor is configured to sample and hold the input signal;
   a switch transistor that has a source terminal coupled to the capacitor and the gate terminal of the second MOS transistor, wherein the switch is configured to cause the capacitor to sample and hold the input signal upon application of an ON voltage; and
   an ON-voltage control transistor that couples a gate terminal of the switch transistor to the specified node when causing the input signal to be sampled and held.

2. The sample-and-hold circuit according to claim 1, wherein
   the differential pair serves as a negative feedback circuit, where the gate terminal of the first MOS transistor serves as a positive input terminal and the gate terminal of the second MOS transistor serves as a negative input terminal, and when the switch transistor is ON, and
   the ON-voltage control transistor couples the gate terminal of the switch transistor to the specified node only in a case where the negative feedback circuit is established.

3. The sample-and-hold circuit according to claim 1, further comprising an OFF-voltage control transistor that applies an OFF voltage to the gate terminal of the switch transistor, the OFF voltage causing the switch transistor to be turned OFF.

4. The sample-and-hold circuit according to claim 1, wherein a voltage of the specified node is a sum of a voltage of the input signal and a gate-to-source voltage in the first and the second MOS transistors.

5. The sample-and-hold circuit according to claim 1, further comprising a power-supply-voltage supply line that supplies a power supply voltage,
   wherein a voltage of the specified node when the input signal is sampled and held is a voltage lower than the power supply voltage.

6. A display device including a comparator circuit to which an image signal is input as an input signal, the comparator circuit including a sample-and-hold circuit, wherein the sample-and-hold circuit comprising:
   a differential pair that includes a first MOS transistor and a second MOS transistor, wherein respective source terminals of the first MOS transistor and the second MOS transistor being interconnected to a specified node, an input signal being input to a gate terminal of the first MOS transistor;
   a capacitor that is coupled to a gate terminal of the second MOS transistor, wherein the capacitor is configured to sample and hold the input signal;
   a switch transistor that has a source terminal coupled to the capacitor and the gate terminal of the second MOS transistor, wherein the switch is configured to cause the capacitor to sample and hold the input signal upon application of an ON voltage; and
   an ON-voltage control transistor that couples a gate terminal of the switch transistor to the specified node when causing the input signal to be sampled and held.

* * * * *